US006972620B2

(12) United States Patent
Diaz et al.

(10) Patent No.: US 6,972,620 B2
(45) Date of Patent: Dec. 6, 2005

(54) POST AMPLIFIER ARRAY INTEGRATED CIRCUIT

(75) Inventors: Nelson Diaz, Westminster, CO (US); Michael Thomas Dudek, Longmont, CO (US)

(73) Assignee: Optical Communication Products, Inc., Woodland Hills, CA (US)

( * ) Notice: Subject to any disclaimer, the term of this patent is extended or adjusted under 35 U.S.C. 154(b) by 30 days.

(21) Appl. No.: 10/782,648

(22) Filed: Feb. 19, 2004

(65) Prior Publication Data

US 2005/0184800 A1 Aug. 25, 2005

(51) Int. Cl.[7] .......................... H03F 3/52; H04J 14/08; H01J 40/14
(52) U.S. Cl. .................... 330/90; 330/296; 250/214 R; 359/135
(58) Field of Search .......................... 330/90, 296, 282, 330/258

(56) References Cited

U.S. PATENT DOCUMENTS

| | | | |
|---|---|---|---|
| 4,366,468 A | 12/1982 | Yoneyama | 340/347 NT |
| 4,388,732 A | 6/1983 | Hansel | 455/608 |
| 4,594,560 A | 6/1986 | Dingwall et al. | 330/296 |
| 4,989,003 A | 1/1991 | Sauer | 341/136 |
| 5,257,285 A | 10/1993 | Thorp | 375/11 |
| 5,281,805 A | 1/1994 | Sauer | 250/214 |
| 5,381,052 A | 1/1995 | Kolte | 327/60 |
| 5,381,146 A | 1/1995 | Kolte | 341/132 |
| 5,442,321 A | 8/1995 | Bayruns et al. | 330/282 |
| 5,528,692 A | 6/1996 | Hester et al. | 380/38 |
| 5,594,576 A | 1/1997 | Sutherland et al. | 359/118 |
| 5,634,202 A | 5/1997 | Connell et al. | 455/110 |
| 5,650,608 A | 7/1997 | Redford et al. | 250/210 |
| 5,696,510 A * | 12/1997 | Paillardet et al. | 348/572 |
| 5,875,126 A | 2/1999 | Minch et al. | 365/185.01 |
| 5,892,220 A * | 4/1999 | Woodward | 250/214 LA |
| 5,973,313 A | 10/1999 | Redford et al. | 250/210 |
| 6,023,191 A | 2/2000 | Connell et al. | 327/554 |
| 6,041,084 A | 3/2000 | Nagaraj | 375/317 |
| 6,091,300 A | 7/2000 | Setty et al. | 330/258 |
| 6,301,033 B1 * | 10/2001 | Kazawa | 398/9 |
| 6,490,005 B1 * | 12/2002 | Steinbach et al. | 348/572 |

OTHER PUBLICATIONS

Web ProForums, "Introduction to Optical Transmission in a Communications Network Tutorial", article, Dec. 3, 2000, International Engineering Consortium.

* cited by examiner

*Primary Examiner*—Lam T. Mai
(74) *Attorney, Agent, or Firm*—Barlow, Josephs & Holmes, Ltd.

(57) ABSTRACT

An optical communication system that includes a multi-channel post amplifier assembly with flexible output configurations for amplifying optical-to-electrical converted signals on selectable groups of amplifier channels is provided. The post amplifier assembly, when implemented on a single IC chip, is capable of operating with either the 2.5V or 3.3V of power supply. In addition, the IC chip containing the post amplifier assembly provides capability to selectively turn off one or more post amplifier channels during operation. Further, the post amplifiers provide integral auto zero function without requiring a use of external capacitors.

20 Claims, 3 Drawing Sheets

POST AMPLIFIER ARRAY INTEGRATED CIRCUIT

BACKGROUND OF THE INVENTION

The present invention relates most generally to the field of transmission and reception of information on optical fibers. More particularly, the present invention relates to an integrated circuit apparatus and method for post amplifying signals received over the optical fibers that are subsequently converted to electrical signals.

In the field of telecommunications, lasers such as vertical cavity surface emitting lasers (VCSELs) and other optoelectronic devices are commonly used for the transmission of information along optical fibers and the like as optical signals. VCSELs, in particular are especially desirable in today's optical communication systems because they are efficient, small in size, readily assembled into arrays, and easy to manufacture.

At the receiving end, the optical signals that are transmitted by the optical fibers are converted by optical detectors into electrical signals, and then post amplified by post amplifiers to increase the voltage level output of the converted electrical signals. Conventional post amplifier circuitry used for amplifying the electrical signals typically works with an input power supply that is restricted to only a single voltage level, and different post amplifier circuits are typically designed for use in systems that have different system voltages.

Further, conventional post amplifier circuits, when implemented on an integrated circuit (IC) chip, do not include the capability to turn on only the relevant portion of the IC chip. Thus, when multiple post amplifier channels are integrated on a single IC chip, all of the amplifiers on all of the channels must be activated. Therefore, the power supplied to the unused channels is wasted, often forcing designers to separate various post amplifier circuits onto separate IC chips that are each tailored to include only those post amplifier channels that will be used for each discrete application. Ultimately, this leads to increase in the number of different types of IC chips that are needed and requires the design and fabrication of multiple post amplifier IC chips instead of one-design-fits-all type of approach.

Another issue with the post amplifiers known in the prior art is that they typically have auto zero function, which is designed to maintain the dc level of the input signals (optical-to-electrical converted signals). Conventional post amplifier circuitry (on an IC chip) typically uses an external capacitor to implement this auto zero function. External capacitors take up space, and its use is undesirable, especially when a post amplifier array is implemented on a single IC chip.

It would therefore be desirable to provide an arrayed post amplifier assembly on a single IC chip with a portion that can be selectively turned off during operation. Further it is desirable to provide a post amplifier assembly that can work with voltage supplies at multiple voltage levels and does not require a use of external capacitors to implement the auto zero function.

BRIEF SUMMARY OF THE INVENTION

In this regard, the present invention provides for an optical communication system that includes a multi-channel post amplifier assembly with flexible output configurations for amplifying optical-to-electrical converted signals on selectable groups of amplifier channels is provided. The post amplifier assembly, when implemented on a single IC chip, is capable of operating with either the 2.5V or 3.3V of power supply therefore allowing integration of the chip into various devices that have different power supply requirements. This feature enhances the modularity of the present invention in that only one IC post amplifier design needs to be manufactured to handle a variety of applications.

In addition, the IC chip containing the post amplifier assembly provides capability to selectively turn off one or more post amplifier channels during operation. Preferably, the post amplifier array is divided into two or more groups. Each of the groups of post amplifier channels and the associated overhead operational circuitry are separated from the power supply by a switch. This architecture allows the switch to be selectively operated to energize additional groups of amplifier channels as the demand for channels increases while turning them off during low demand periods to reduce the power consumption of the device.

Further, the post amplifiers provide integral auto zero function without requiring a use of external capacitors. This is accomplished by providing integrally formed circuitry for each amplifier channel onto the IC chip with the amplifier circuitry. In this manner the footprint of the overall assembly is greatly reduced while the performance is maintained.

It is therefore an object of the present invention to provide a novel array of post amplifier circuits that can be integrated onto a single IC chip in a modular manner for flexible integration. Further it is an object of the present invention to provide a compact and flexible functionality in that only the required number of channels necessary to operate the desired function or at the desired bandwidth must be energized thereby saving on the power consumption of the system during lower demand operations. It is yet another object of the present invention to create a single modular post amplifier IC design to be integrated into various different component systems while reducing overall design and manufacturing costs, resulting from prior art one-off design techniques.

Other objects, features and advantages of the invention shall become apparent as the description thereof proceeds when considered in connection with the accompanying illustrative drawings.

BRIEF DESCRIPTION OF THE DRAWINGS

In the drawings which illustrate the best mode presently contemplated for carrying out the present invention.

DETAILED DESCRIPTION OF THE INVENTION

I. Overview

Figure 1:
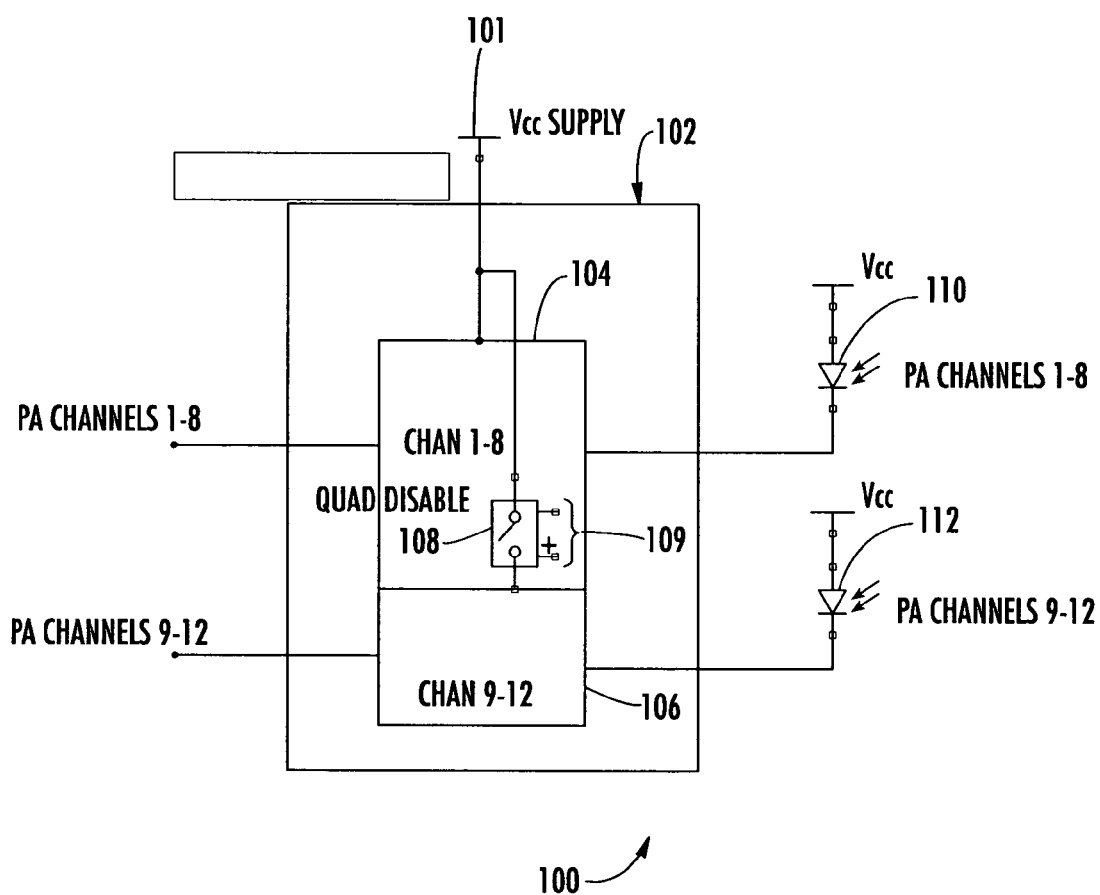
FIG. 1 is a block diagram of an optical receiver array including a post amplifier array in an embodiment according to the present invention.

Referring now to the drawings, FIG. 1 is a block diagram of an optical receiver array 100 in one embodiment of the present invention. The optical receiver array 100 includes a post amplifier array 102 and optical detector arrays 110 and 112 to receive multi-channel optical signals. Each of the optical detector arrays 110 and 112 may represent one or more optical detectors. For example, as illustrated in FIG. 1, the optical detector array 110 represents eight optical detectors for interfacing with post optical detector arrays 110 and 112 may include different number of optical detectors, and the total number of optical detectors used may be different from twelve.

Each one of the post amplifier channels 1–12 may be used for high speed data receiving. For example, in this embodiment, each channel is capable of receiving up to 2.5 Gigabits per second (Gbps) of data. In other embodiments, the post amplifier channels may be used to receive data at a rate that is even higher than 2.5 Gbps.

In practice, the optical receiver array 100 includes a transimpedance amplifier (TIA) (not shown) that corresponds to each post amplifier channel 1–12 since the optical detectors typically generate current as output. The TIAs, therefore, preferably are used to convert the current output of the optical detectors into a voltage signal that is supplied to the post amplifier array 102.

II. Optional Power Supply Alternatives of 2.5 Volt and 3.3 Volt

The post amplifier array 102 preferably is implemented on a single integrated circuit (IC) chip for reduction of space it occupies in the overall optical receiver array 100. The TIAs that are coupled to the photo detectors may be implemented on the same IC chip or they may be implemented externally to the IC chip containing the post amplifier array 102. The post amplifier array 102 (on a single IC chip) is capable of operating with a power supply 101 of either 2.5V or 3.3V. While power and heat dissipation is reduced when the 2.5V power supply 101 is applied to the IC chip as compared to when the 3.3V power supply 101 is used. The ability for the IC chip to operate using a 3.3V power supply 101 allows the post amplifier array 102 to work together with other IC chips in an overall system that utilizes a 3.3V power supply 101. This eliminates the need for a DC-to-DC power conversion means or use of an additional 2.5V power supply to provide power to the post amplifier array 102. In other embodiments, the supply voltage levels 101 that the post amplifier array 102 is capable of working with may be different from 2.5V and/or 3.3V disclosed herein. Further, the post amplifier array 102 may also be able to operate in a system having more than two different supply voltage levels 101.

III. The Post Amplifier Array Power Down Feature

The post amplifier array 102 of the present includes a power down feature. The post amplifier array 102 of the exemplary embodiment shown in FIG. 1 includes a first group of post amplifiers 104, a second group of post amplifiers 106 and a power down select switch 108. The first group of post amplifiers 104 includes an array of post amplifiers corresponding to eight post amplifier channels 1–8. The second group of post amplifiers 106 includes an array of four post amplifiers corresponding for four post amplifier channels 9–12. Each group of post amplifiers 104 and 106 includes the required overhead circuitry to perform necessary associated overhead functions that are preferably shared by all post amplifiers in the group. Clearly, the number of post amplifiers in each group 104 and 106 of post amplifiers may be different in other embodiments as may be required for the particular application into which the post amplifier array 102 may be incorporated. Further, the total number of post amplifiers may be different from twelve. The number of channels, eight in one group 104 and four in another group 106, for a total of twelve channels, is simply an example. It can be appreciated that additional configurations having more groups with more or less channels per group would still fall within the principles and disclosure of the present invention.

The first group of post amplifiers 104 and the associated overhead circuitry is coupled directly to the power supply 101. However, the second group of post amplifiers 106 and the associated overhead circuitry is coupled to the power supply 101 via the power down select switch 108. Power down select signals 109 are provided to the power down select switch 108 to open and close the switch 108 thereby selectively energizing the post amplifier channels in the secondary group 106 on the post amplifier array 102.

During normal operation, the first group of post amplifiers 104 and the associated overhead circuitry always receive power from the power supply 101 and are therefore always active. When the power down select switch 108 is in the closed position, the power supply 101 also provides power to the second group of post amplifiers 106 and the associated overhead circuitry, allowing the second group of amplifiers 106 energize and interface with four channels of additional electrical signals from the secondary photodetector array 112. When the power down select switch 108 is open, however, the second group of post amplifiers 106 and the associated overhead circuitry are not powered, thereby reducing the overall power consumption of the overall post amplifier array 102 when the secondary array of photodetectors 112 are not active.

With this option for selectively controlling the power 101 supplied to one or more of the post amplifier channels in the post amplifier array 102, power may be saved when less than all the post amplifiers in the post amplifier array 102 are needed to meet post amplifying needs for low power dissipation or low bandwidth applications. At the same time, availability of the additional post amplifier channels allows for a flexible design so that a single post amplifier array 102 in a single IC chip design may be used for multiple different applications allowing the flexibility to handle higher bandwidth applications when the need arises.

In the post amplifier array 102 shown in FIG. 1, there are total of twelve post amplifier channels in two groups 104, 106. One group 106 of post amplifiers includes four channels that may be selectively turned on and off as necessary using signals 109 that are transmitted to power down select switch 108. In other embodiments, there may be more or less than twelve post amplifiers in the post amplifier array. In addition, the number of post amplifiers that may be switched off and on may be different. For example, the post amplifier array may include eight, twelve or any other suitable number of post amplifiers. Further, other embodiments may include more than one power down select switch to switch more than one group of post amplifiers on and off.

The post amplifier array 102 with selective power down feature may be applied to various different types of receiver array circuits 110, 112 including but not limited to long wave VCL (vertical cavity laser) receiver array circuits, shortwave VCL receiver array circuits and distributed feedback (DFB) laser receiver array circuits.

The present invention provides the ability to produce a post amplifier array 102 in a modular manner wherein modular arrays having multiple groups, each group containing multiple post amplifier channels create flexible post amplifier IC chips. Therefore a single post amplifier chip could be manufactured that could serve the needs of applications ranging from single post amplifier channels to as many as 24 post amplifier channels for example in flexible channel step configurations of 4, 8, 12, 16, 20 and 24 simultaneous operational channels. Similarly, channels could be grouped by 2, 4, 6 or 8. These examples are provided simply as examples and are fro illustration and are not considered as limitations on the range of possible configurations that the present invention may take. In many system applications, use of a single modular part rather than multiple different parts, each having an array that includes a different number of post amplifiers in the post amplifier array will result in cost reduction and reduction of manufacturing management needs due to production of greater volume for a single part.

The power down function for the post amplifier array IC 102 allows for the selective shut down of unused channels and nonessential overhead functions. As a way of an additional illustrative example, four channels 106 may be disabled from a 12 channel IC 102 that requires only eight channels 104 for the specific application that is currently being processed. This allows for one IC 102 to be used for multiple applications taking advantage of economy of scales and simplified manufacturing processes.

Figure 2:
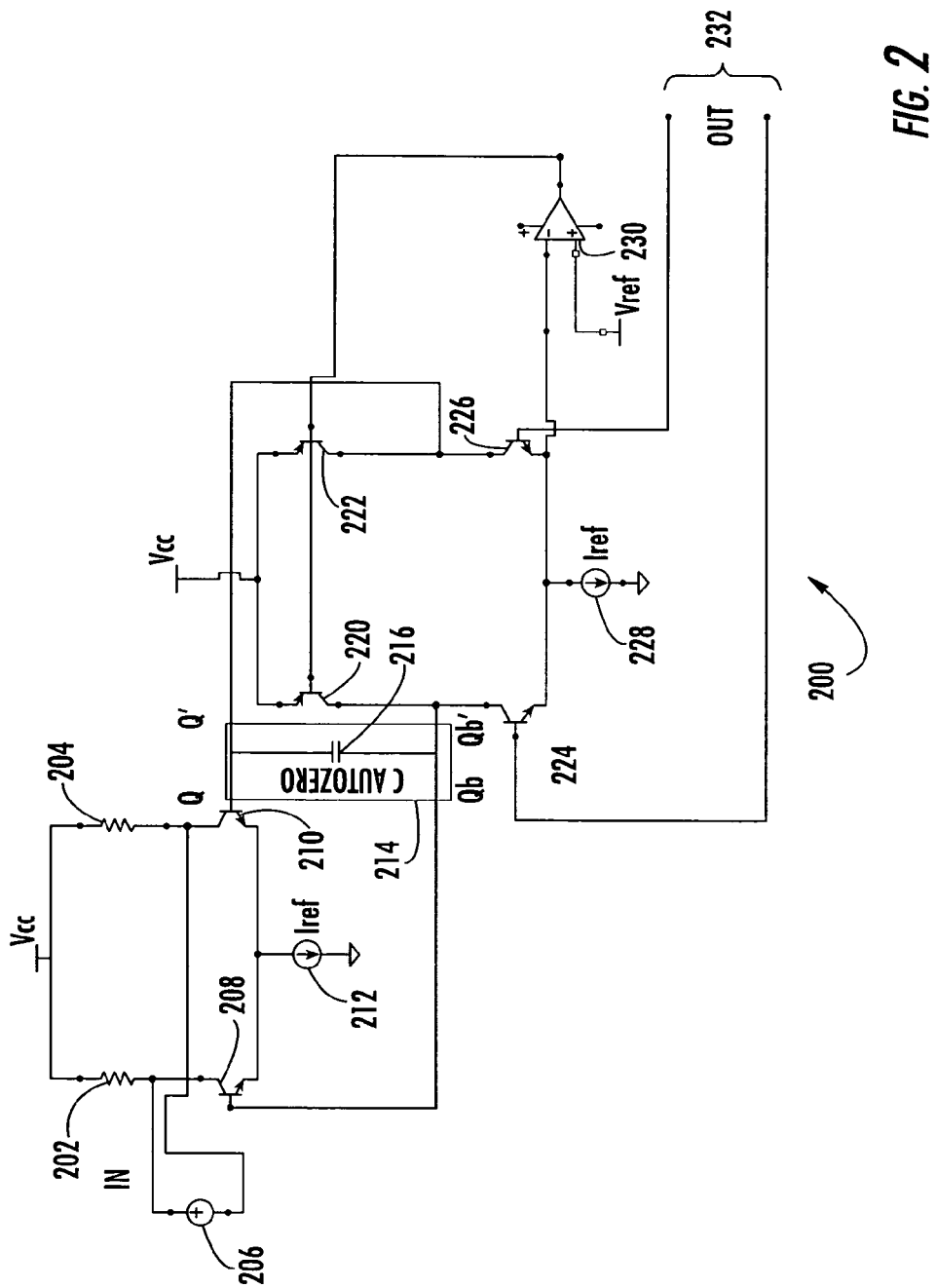
FIG. 2 is a circuit diagram of post amplifier circuitry in an embodiment according to the present invention.

IV. Internal Auto Zero Capacitor—Implementation Using Slow Discharge of Transistor Base Leakage Current Turning now to FIG. 2, a circuit diagram of a post amplifier 200 in an embodiment according to the present invention is illustrated. The post amplifier 200 is implemented using bipolar transistors as can be seen in FIG. 2. The bipolar transistors typically provide better performance at high frequency operations than CMOS transistors. Further, CMOS transistors typically consume more power at high frequencies to obtain the same bandwidth as the bipolar transistors. In other embodiments, however, other types of transistors, such as, for example, MOSFETs (Metal-Oxide-Silicon Field Effect Transistors) or JFETs (Junction Field Effect Transistors) may be used to implement the post amplifier circuit 200.

The post amplifier 200 preferably receives a differential input 206, which may be provided over any one of the post amplifier channels 1–12 of FIG. 1. The post amplifier 200 includes resistors 202 and 204, respectively, between the power supply Vcc and collectors of input transistors 208 and 210. The resistors 202 and 204 serve to regulate and apply the correct voltage from the power supply Vcc to the transistors 208 and 210. The collectors of the input transistors 208 and 210 receive the differential input 206. As can be seen in FIG. 2, the input transistors 208 and 210 are NPN bipolar transistors. In other embodiments, PNP bipolar transistors may also be used as the input transistors.

Emitters of the input transistors 208 and 210 are coupled to a current source 212, which supplies a reference current Iref. Bases of the input transistors 208 and 210 provide a differential output to collectors of output transistors 224 and 226. The output transistors 224 and 226 are NPN bipolar transistors. In other embodiments, PNP transistors may be used as the output transistors. Emitters of the output transistors 224 are 226 are coupled to a current source 228, which provides a reference current Iref. Design of the circuitry to provide the desired reference current Iref as described with respect to both current supply 212 and 228 is well known to those skilled in the art.

The emitters of the output transistors 224 and 226 are also coupled to an inverting terminal of an operational amplifier (op amp) 230. A non-inverting terminal of the op amp 230 is coupled to a reference voltage Vref, and the output of the op amp 230 is connected to the bases of gain control transistors 220 and 222, which are PNP bipolar transistors. In other embodiments, the gain control transistors may be NPN transistors. Design of the circuitry to provide the reference voltage Vref is well known to those skilled in the art.

Emitters of the gain control transistors 220 and 222 are coupled to the power supply Vcc. Collectors of the gain control transistors 220 and 222 are coupled to the collectors of the output transistors 224 and 226, respectively. Bases of the output transistors 224 and 226 provide a differential output 232 of the post amplifier 200.

In accordance with the principles of the present invention, an auto zero circuit 214 is integrally included into the post amplifier circuitry 200 and is coupled between the differential output (bases) of the input transistors 208 and 210. The auto zero circuit 214 provides the auto zero function that would be provided by an equivalent capacitor 216 that in the prior art would be an external element. The auto zero function maintains the dc level of the differential input signal. If the dc component of the differential input signal sways from zero, the auto zero function preferably compensates the input signal to return the dc component of the input signal to zero.

Conventional IC chips containing a post amplifier typically use an external capacitor (to the IC chip) to implement the auto zero function described herein. Use of the external capacitor is undesirable due to space limitations, and it is a particularly important issue when a post amplifier array is implemented on a single IC chip since an individual external capacitor is necessary for each post amplifier that corresponds to each channel contained thereon. The auto zero circuit 214 performs the function of an external capacitor (as indicated by the equivalent capacitor 216) in this embodiment according to the present invention.

Figure 3:
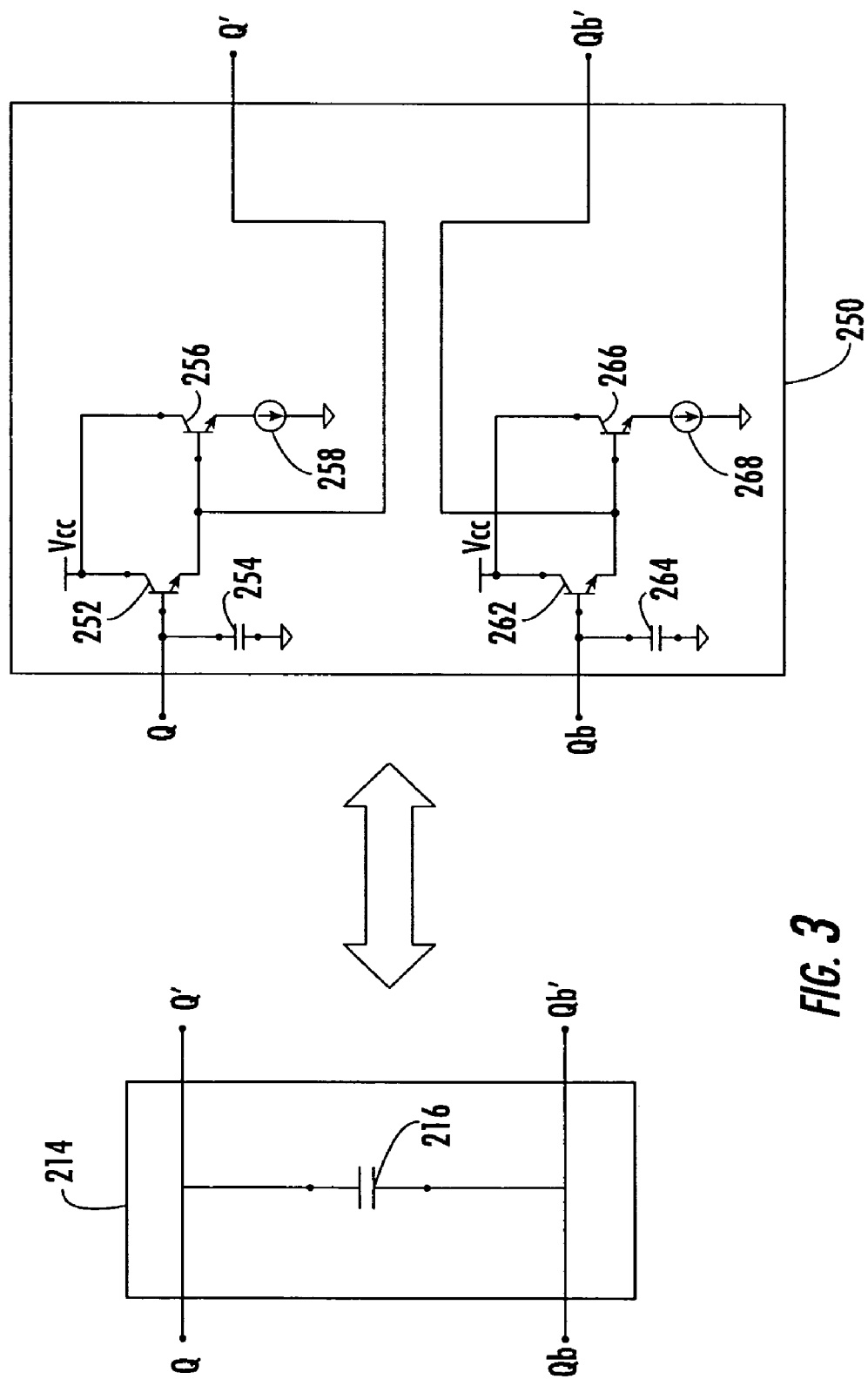
FIG. 3 is a circuit diagram of circuitry that provides slow discharge of transistor base leakage in an embodiment according to the present invention.

Turning now to FIG. 3 the auto zero circuit 214 as it would operate using an equivalent capacitor 216 in the prior art and a circuit diagram showing an auto zero circuit 250 that is an internal replacement for the external auto zero circuit 214 in an embodiment according to the present invention. The auto zero circuit 250 includes a non-inverted differential circuit including an input transistor 262, a signal accumulation capacitor 264, an auto zeroing transistor 266 and a current source 268. Similarly, the auto zero circuit 250 also includes an inverted differential circuit including an input transistor 252, a signal accumulation capacitor 254, an auto zeroing transistor 256 and a current source 258. The input transistors 252, 262 and the auto zeroing transistors 256, 266 in this embodiment are bipolar NPN transistors. In other embodiments, the input transistors and the auto zeroing transistors may be PNP transistors. The base leakage currents of the auto zeroing transistors 256 and 266, respectively, are used to perform the auto zero function for the inverted and non-inverted inputs, respectively. Since both the inverted differential circuit and the non-inverted differential circuit has identical configuration, the auto zero circuit 250 will be described only in reference to the non-inverted differential circuit, hereinafter.

The base of the input transistor 262 preferably receives a non-inverted input signal from, for example, the input transistor 208 of FIG. 2. The base of the input transistor 262 is also coupled to ground via the signal accumulation capacitor 264 to decrease the impedance at this point in the circuit. Collectors of the input transistor 262 and the auto zeroing transistor 266 are coupled to the power supply Vcc. The emitter of the input transistor 262 provides an output voltage at a base of the auto zeroing transistor 266. The emitter of the auto zeroing transistor 266 is coupled to a current source 268. The current source 268 is coupled to ground. The current source 268 in FIG. 3 provides 1 mA of current. The current sources in other embodiments may provide currents with other magnitude as would be appreciated by those skilled in the art.

The base of the auto zeroing transistor 266 and the emitter of the input transistor 262 are provided as the output of the auto zero circuit 250. For example, when the dc component of the output portion provided by the input transistor 262 strays from zero, the base leakage current from the auto zeroing transistor 266 preferably adjusts the dc components to zero voltage.

It should be emphasized that the above-described embodiments are intended to be exemplary only. The specific arrangement of the components of the integrated circuit and the details of the method generally covered by the integrated circuit, are exemplary only. The integrated circuit including the post amplifier array of the present inventor may be integrated into larger integrated circuits including other features, without departing from the scope of the present invention.

It can therefore be seen that the present invention provides a novel array of post amplifier that can be integrated onto a single IC chip in a modular manner for flexible integration. Further the present invention provides compact and flexible functionality in that only the required number of channels necessary to operate the desired function or at the desired bandwidth must be energized thereby saving on the power consumption of the system during lower demand operations. Further this allows a single modular post amplifier IC design to be integrated into various different component systems while reducing overall design and manufacturing costs resulting from prior art one-off design techniques. For these reasons, the instant invention is believed to represent a significant advancement in the art, which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed:

1. A post amplifier array implemented on an integrated circuit (IC) chip for use in optical communications applications, the post amplifier array comprising:
    a plurality of post amplifiers disposed on a single integrated chip; and
    an array of optical detectors for receiving optical signals and converting said optical signals to electronic data signals, said optical detectors in electronic communication with said plurality of post amplifiers,
    wherein said plurality of post amplifiers receive said electronic data signals from said array of optical detectors, amplify the received data signals, and output the amplified data signals, wherein the post amplifiers are capable of operating one of a plurality of preselected and preset input voltage levels.

2. The post amplifier array of claim 1, wherein the different input voltage levels are approximately 2.5V and 3.3V.

3. The post amplifier array of claim 1, further comprising:
    said plurality of post amplifiers organized into first and second groups; and
    a switch located between the second group of post amplifiers and an input power supply, wherein said first group of the post amplifiers is always electrically coupled to the input power supply to receive power during normal operation, and wherein the second group of post amplifiers are selectively electrically coupled to the input power supply to receive power only when the switch is turned on.

4. The post amplifier array of claim 3, wherein each of the first and second groups of post amplifiers is associated with overhead function circuitry, wherein the overhead circuitry associated with the first group always receives power during normal operation, and wherein the overhead circuitry associated with the second group receives power only when the switch is turned on.

5. The post amplifier array of claim 3, wherein the first group includes eight post amplifiers and the second group includes four post amplifiers.

6. The post amplifier array of claim 1, further comprising:
    auto zero circuitry integrally connected to each individual post amplifier for performing an auto zero function of zeroing the dc component of the received data signals, wherein the auto zero circuitry does not require the use of an external capacitor to perform the auto zero function.

7. The post amplifier array of claim 6, wherein the auto zero circuitry includes a transistor, said transistor having a base, wherein leakage current from said base is used to perform the auto zero function.

8. The post amplifier array of claim 3, further comprising:
    auto zero circuitry integrally connected to each individual post amplifier for performing an auto zero function of zeroing the dc component of the received data signals, wherein the auto zero circuitry does not require the use of an external capacitor to perform the auto zero function.

9. The post amplifier array of claim 8, wherein the auto zero circuitry includes a transistor, said transistor having a base, wherein leakage current from said base is used to perform the auto zero function.

10. A post amplifier array implemented on an integrated circuit (IC) chip, the post amplifier array comprising:
    a plurality of individual post amplifiers, each post amplifier capable of receiving a data signal, amplifying the received data signal, and outputting the amplified data signal, the individual post amplifiers being organized into first and second groups; and
    a switch located between the Second group of post amplifiers and an input power supply, wherein said first group of the post amplifiers is always electrically coupled to the input power supply to receive power during normal operation, and wherein the second group of post amplifiers are selectively electrically coupled to the input power supply to receive power only when the switch is turned on.

11. The post amplifier array of claim 10, wherein each of the first and second groups of post amplifiers is associated with overhead function circuitry, wherein the overhead circuitry associated with the first group always receives power during normal operation, and wherein the overhead circuitry associated with the second group receives power only when the switch is turned on.

12. The post amplifier array of claim 10, wherein the first group includes eight post amplifiers and the second group includes four post amplifiers.

13. The post amplifier array of claim 10, wherein the post amplifiers are capable of operating with multiple different input voltage levels.

14. The post amplifier array of claim 13, wherein the different input voltage levels are approximately 2.5V and 3.3V.

15. The post amplifier array of claim 10, further comprising:
   auto zero circuitry integrally connected to each individual post amplifier for performing an auto zero function of zeroing the dc component of the received data signals, wherein the auto zero circuitry does not require the use of an external capacitor to perform the auto zero function.

16. The post amplifier array of claim 15, wherein the auto zero circuitry includes a transistor, said transistor having a base, wherein leakage current from said base is used to perform the auto zero function.

17. A post amplifier implemented on an integrated circuit (IC) chip, the post amplifier comprising:
   input means for receiving data signals;
   amplifying means for amplifying the received data signals;
   output means for transmitting the amplified data signals; and
   auto zero circuitry for performing an auto zero function of zeroing the dc component of the received data signals, wherein the auto zero circuitry does not require the use of an external capacitor to perform the auto zero function.

18. The post amplifier of claim 17, wherein the auto zero circuitry comprises a transistor, said transistor having a base, wherein leakage current from said base is used to perform the auto zero function.

19. The post amplifier of claim 17, wherein the post amplifier is capable of operating with multiple different input voltage levels.

20. The post amplifier of claim 17, wherein the different input voltage levels are approximately 2.5V and 3.3V.

* * * * *